United States Patent [19]

Nejime et al.

[11] Patent Number: 4,866,444
[45] Date of Patent: Sep. 12, 1989

[54] ANALOG-TO-DIGITAL CONVERTER

[75] Inventors: Yoshito Nejime, Musashino; Masao Hotta, Hanno; Kenji Maio; Koichi Ono, both of Tokyo, all of Japan

[73] Assignee: Hitachi, Ltd., Tokyo, Japan

[21] Appl. No.: 154,086

[22] Filed: Feb. 9, 1988

[30] Foreign Application Priority Data

Mar. 20, 1987 [JP] Japan .................................. 62-63783

[51] Int. Cl.⁴ .............................................. H03M 1/36
[52] U.S. Cl. ..................................... 341/159; 341/158
[58] Field of Search ............... 341/120, 126, 155, 156, 341/159, 160, 158, 164

[56] References Cited

U.S. PATENT DOCUMENTS 4,417,233 11/1983 Inoue et al. ......................... 341/156
4,639,715 1/1987 Doluca ................................. 341/120

FOREIGN PATENT DOCUMENTS 59-107629 6/1984 Japan .

Primary Examiner—William M. Shoop, Jr.
Assistant Examiner—Brian K. Young
Attorney, Agent, or Firm—Kenyon & Kenyon

[57] ABSTRACT

A flash type AD converter includes a group of comparators divided into blocks each including $2^N$ comparators (N=1, 2, ---), each comparing an input signal with one of a plurality of reference signals, each having individually different voltage levels. One of the comparators may correspond to a level change point where the voltage level of the input signal is higher than that of the reference signal of that comparator which then generates a specific output different from those of the remaining comparators. The converter generates a binary-coded output on the basis of the specific output generated from the level change point comparator. When any one of the plural comparators belonging to one of the blocks generates the specific output, the specific output is applied as an inhibit signal to inhibit appearance of an output from a block including comparators having reference voltage signals with corresponding levels lower than those of the comparators of the block to which the comparator generating the specific output belongs.

11 Claims, 5 Drawing Sheets

ANALOG-TO-DIGITAL CONVERTER

BACKGROUND OF THE INVENTION

1. Field of the Invention

This invention relates to a code conversion circuit, and more particularly to a flash type AD converter of monolithic IC structure operable at a high speed.

2. Description of the Prior Art

A flash type AD converter includes a plurality of comparators operating in parallel to each other for deciding the level of its input signal, and an output pattern of the comparator group is converted into a signal coded according to a desired code. Although the conversion rate of AD converters of this type commonly ranges from several-ten MHz to several-hundred MHz, the bandwidth of their inputs is limited to frequencies far lower than the above range in most of these AD converters. When an input signal having a frequency exceeding the above limit is applied to the flash type AD converter, a missing code attributable to nonuniformity of response speeds of individual comparators tends to occur. When such a missing code occurs, the value of the digital output signal of the AD converter can no longer be guaranteed.

An example of a flash type AD converter having means for preventing occurrence of such a missing code is disclosed in JP-A-59-107629 (1984). The disclosed AD converter includes, as encoders converting output patterns of plural comparators into binary signals, a plurality of primary stage encoders generating predetermined less significant bits of the binary signals and a single final stage encoder receiving the outputs of these primary stage encoders to generate all of the bits of the binary signals. The disclosed AD converter further includes gate circuits inserted in bit output lines leading from the individual primary stage encoders to the final stage encoder as means for preventing occurrence of a missing code, and a signal representing the logical sum of binary outputs generated from the primary stage encoders of higher order and appearing on the individual bit output lines is applied to the gate circuits as an inhibit signal. Therefore, simultaneous generation of binary outputs from the plural primary stage encoders is prevented, so that the occurrence of a missing code due to simultaneous double appearance of outputs from the unit circuit blocks, each including one of the primary stage encoders, can be prevented.

However, in such a missing code preventive circuit, the size of the circuit blocks gated by the inhibit signal has been determined by the number of the comparators that can be connected to each of the individual primary stage encoders due to the chip layout. Also, when the frequency of the input signal applied to the AD converter is very high, the plural comparators in the circuit block may simultaneously generate their outputs. Therefore, with such a missing code preventive circuit, there has been a limitation in the effect for raising the limit of the input bandwidth. Furtner, because of the necessity for provision of OR gates to obtain the OR signal described above, the missing code preventing circuit has inevitably occupied a relatively large area on the semiconductor chip.

SUMMARY OF THE INVENTION

It is an object of the present invention to provide a flash type AD converter which can operate with an input bandwidth including frequencies higher than heretofore shown.

Another object of the present invention is to provide a flash type AD converter in which its missing code preventive circuit occupies a smaller area on a semiconductor chip than heretofore shown.

Still another object of the present invention is to provide a flash type AD converter in which the size of a circuit block gated by an inhibit signal applied from a circuit block of higher order can be freely determined without being limited by the chip layout.

Yet another object of the present invention is to provide a flash type AD converter which can operate with a low power supply voltage.

It is another feature of the present invention that an inhibit signal for gating an output of a circuit block is derived from outputs of comparators instead of being derived from binary bit output lines of primary stage encoders.

It is another feature of the present invention that comparators are not only divided to constitute blocks belonging to individual primary stage encoders but also divided into smaller unit circuit blocks, and a signal representing the logical sum of outputs of plural comparators belonging to comparator circuit blocks of higher level is used to inhibit generation of outputs from comparators belonging to comparator circuit blocks of lower level.

DESCRIPTION DETAILED

For a better understanding of the present invention, the structure of a conventional flash type AD converter will be first described. (The AD converter will be abbreviated hereinafter as an ADC.)

Figure 1:
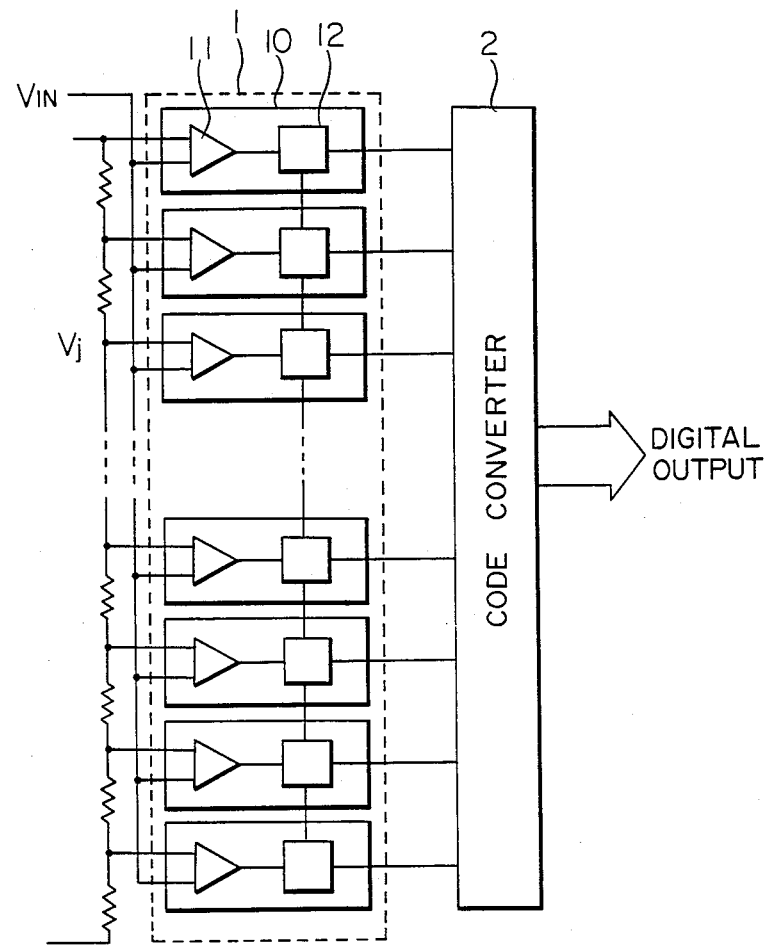
FIG. 1 shows the structure of a prior art flash type AD converter.

As shown in FIG. 1, a conventional flash type ADC generally includes a comparator group 1, consisting of $(2^n-1)$ comparators 10 (n: the number of output bits) for comparing an analog input voltage $V_{IN}$ with respective reference voltages $V_j$ obtained by dividing a highest analog input voltage into $(2^n-1)$ levels, and a code conversion circuit 2 converting an output pattern of each of these comparators 10 into a binary-coded signal. (The number of the comparators 10 is $2^n$ when an overflow is included.) Each of the comparators 10 includes a part 11 comparing the analog input voltage $V_{IN}$ with its own reference voltage $V_j$ and an exclusive-OR circuit 12. When the reference voltages $V_j$ are lower than the input voltage $V_{IN}$, high voltage signals (which will be referred to hereinafter as signals of "H" level) are generated from the corresponding comparing parts 11, while when the reference voltages $V_j$ are higher than the input voltage $V_{IN}$, signals of "L" level appear from the corresponding comparing parts 11. The outputs of the comparing parts 11 in each pair of the comparators 10 receiving the reference voltages Vj of adjacent levels respectively are checked for coincidence by the associated exclusive-OR circuits 12. Therefore, an output signal of "H" level appears only from the exclusive-OR circuit 12 corresponding to the position where the outputs of the series of the comparing parts 11 change from an "H" level to an "L" level, and output signals of "L" level appear for all of the remaining exclusive-OR circuits 12. That is, this exclusive-OR circuit 12 generating the output signal of "H" level corresponds to the level of the input voltage $V_{IN}$. This output signal of "H" level from the exclusive-OR circuit 12 is applied to the code conversion circuit 2. The code conversion circuit 2 is constituted by wired-OR connections of individual binary code bit lines connected to the outputs of the exclusive-OR circuits 12.

In the prior art ADC having the structure described above, a latching comparator is commonly used as the comparing part 11 of each of the comparators 10. However, when an input signal changing at a high speed is applied to the ADC, two or more exclusive-OR circuits 12 tend to simultaneously generate output signals of "H" level due to a time lag of application of the input signal to the individual comparators 10 or a time lag of application of the clock signal to the individual latching comparators 11, although primarily the exclusive-OR circuit 12 of only one comparator 10 should generate an output signal of "H" level. Because of the OR logic function of the code conversion circuit 2, a digital output having an entirely different value appears from the code conversion circuit 2, and a so-called missing code results. Especially, a serious missing code occurs at a point where a "0" in a more significant bit position turns into a "1". Suppose, for example, that the digital output of the code conversion circuit 2 should be "0111 --- 11" according to the binary notation when the output signal of "H" level is applied from the corresponding comparator 10. However, when the next adjacent comparator 10 representing the next value generates also an output signal of "H" level, the digital output of the code conversion circuit 2 is now "1111 --- 11" representing the logical sum of "0111 --- 11" and "1000 --- 00", and the resultant error is as large as ½ of the full scale.

Figure 2:
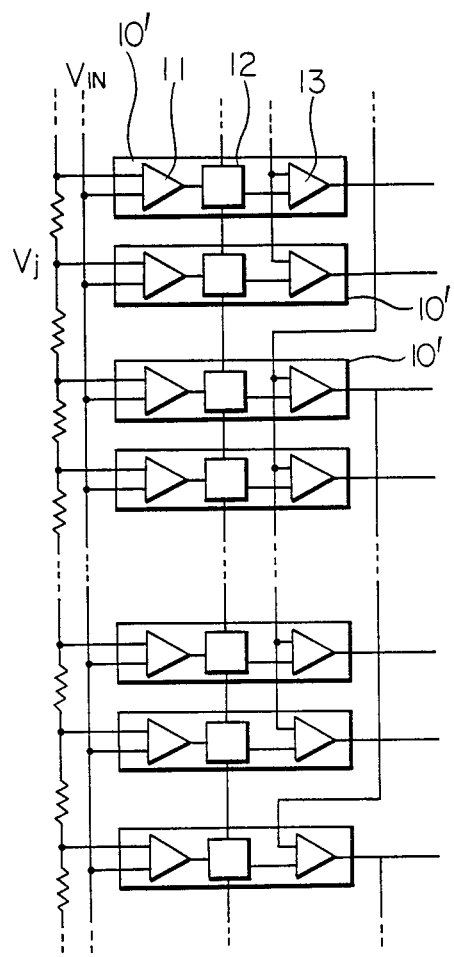
FIG. 2 shows the structure of a first embodiment of the flash type AD converter according to the present invention.

A first embodiment of the present invention will now be described with reference to FIG. 2 in which like reference numerals are used to designate like parts appearing in FIG. 1. Referring to FIG. 2, comparators 10' are divided into a plurality of blocks, and each of the individual comparators 10' in each block includes a comparing part 11 comparing an input voltage $V_{IN}$ with its own reference voltage Vj, an exclusive-OR circuit 12, and a latch 13 with a reset terminal. When the reference voltages Vj are lower than the input voltage $V_{IN}$, signals of "H" level are generated from the corresponding comparing parts 11, while when the reference voltages Vj are higher than the input voltage $V_{IN}$, signals of "L" level appear from the corresponding comparing parts 11. The outputs of the comparing parts 11 in each pair of the comparators 10' receiving the reference voltages Vj of adjacent levels respectively are checked for coincidence by the associated exclusive-OR circuits 12. Therefore, an output signal of "H" level appears only from the exclusive-OR circuit 12 corresponding to the position where the outputs of the series of the comparing parts 11 change from an "H" level to an "L" level, and output signals of "L" level appear from all of the remaining exclusive-OR circuits 12. In each of the comparators 10' belonging to that block, the output of the exclusive-OR circuit 12 is connected to the set input of the latch 13, and an inhibit signal representing the logical sum of the outputs of plural comparators 10' in the comparator block of next higher order is connected to the reset input of the latch 13. When the inhibit signal is in its "L" level, the latch 13 latches the output of the exclusive-OR circuit 12 intact, while when the inhibit signal is in its "H" level, the latch 13 latches the "L" level regardless of the level of the output of the exclusive-OR circuit 12. Thus, when the inhibit signal from the comparator block of next higher order is applied as the reset input to all the latches 13 in the comparators 10' belonging to the comparator block of next lower order, the outputs of the comparators 10' belonging to the latter comparator block can be gated by the logical sum of the outputs of plural comparators 10' belonging to the former comparator block.

Figure 3:
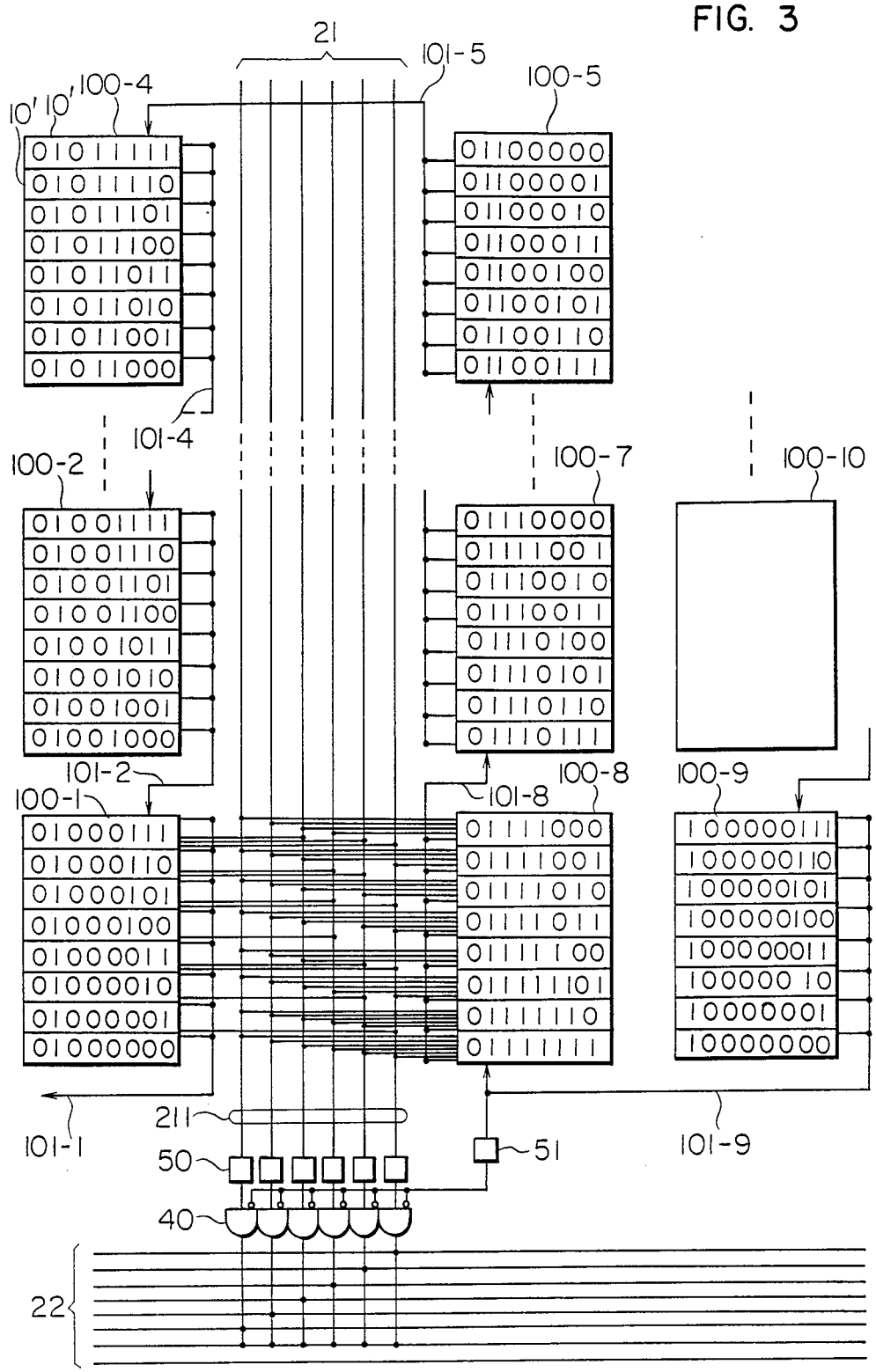
FIG. 3 shows the detailed structure of the first embodiment shown in FIG. 2.

The structure of the first embodiment will be described in further detail with reference to FIG. 3. In FIG. 3, the reference numerals 100-1, 100-2, ---, 100-10 designate the blocks of the comparators 10' described with reference to FIG. 2. Each of the individual comparator blocks includes eight comparators 10'. The numerical values shown in the individual comparators 10' forming one block indicate the binary coded ones corresponding to the respective comparators, and, in this case, the number of bits is eight. Therefore, the total number of the comparators 10' in the ADC is $2^8 = 256$, and the total number of the comparator blocks is 32. FIG. 3 shows part of those comparator blocks only. The outputs of the comparators 10' belonging to the eight comparator blocks 100-1, 100-2, ---, 100-8 (in which the blocks 100-3 and 100-6 are not shown in FIG. 3) are connected to a primary stage encoder 21 according to the corresponding binary coded values, and less significant six bits of the digital output signal are determined by 6-bit binary output lines 211 of the primary stage encoder 21. There are a total of four primary stage encoders corresponding to such eight comparator blocks 100-1, 100-2, ---, 100-8. The second primary stage encoder 21 among them is shown in FIG. 3. Comparator blocks 100-9 and 100-10 shown in FIG. 3 are part of comparator blocks connected to the third primary stage encoder. Primarily, only one comparator 10' corresponding to an input signal level generates its output signal of H level. Therefore, only one of the four primary stage encoders 21 generates its binary output signal. Binary output lines of these primary stage encoders 21 are connected to a final stage encoder 22 through buffers 50 and inhibit gates 40, thereby determining the 8-bit binary output of the ADC. The reference numerals 101-1, 101-2, ---, 101-9 designate signal lines through which inhibit signals are supplied from the comparator blocks 100-1, 100-2, ---, 100-9 to the comparator blocks of next lower levels respectively. These signal lines 101-1, 101-2, ---, 101-9 are connected in a wired-OR mode to the outputs of the latches (13 in FIG. 2) of the eight comparators 10' in the respective comparator blocks. Further, the inhibit signal from the comparators 10' in the comparator block of next higher order is applied to all the latches 13 of the eight comparators 10' in the comparator block of next lower order. Thus, when an output signal of "H" level is generated from any one of the comparators 10' of, for example, the comparator block 100-2, all the outputs from the eight comparators 10' of the comparator block 100-1 are inhibited. Therefore, even when the response speed of the comparator block 100-2 responding to an input signal differs from that of the comparator block 100-1 due to a jitter of the clock signal or due to non-uniformity of the response characteristics of the circuit elements themselves, occurrence of a missing code attributable to simultaneous generation of outputs from two comparators can be prevented. Similarly, in the case of the other comparator blocks (not shown) too, an inhibit signal is applied from the block of next higher level to the block of next lower level. Thus, the upper limit of the convertible input bandwidth can be greatly raised. It is a general tendency that the lower the power supply voltage, more marked is the non-uniformity of the response characteristics of the circuit elements of the comparators. However, the ADC can satisfactorily operate trouble-free even at a low power supply voltage because of the provision of the missing bit preventive circuit having features as described above.

Further, the first embodiment is constructed so that the inhibit signal from each of the comparator blocks of lowest order (the blocks 100-1 and 100-9 in FIG. 3) among the eight comparator blocks connected to one of the primary stage encoders 21 is used to inhibit generation of a binary output from the primary stage encoder of the next lower order. More precisely, the signal line 101-9 transmitting the inhibit signal from the comparator block 100-9 is connected through a latch 51 to the inhibit inputs of the inhibit gates 40 inserted in the binary output lines 211 of the primary stage encoder 21. Thus, occurrence of a missing code can be prevented even if any one of the comparator blocks 100-1 to 100-8 and the comparator block 100-9 may simultaneously generate their output signals. Therefore, at least the most and next significant two bits in the output of the ADC can be guaranteed even when the frequency of the input signal is very high.

The number l of the comparators constituting one block can be freely selected, and the number m ($0 \leq m \leq l$) of the comparators, for which the logical sum of their outputs is taken to produce an inhibit signal to be applied to the comparator block of next lower order, can also be freely selected. However, simultaneous generation of output signals of "H" level due to a jitter of the clock signal or due to a nonuniform delayed response to the input signal occurs in the relatively adjacent comparators and does not occur in the relatively remote comparators. Therefore, the values of l and m need not be large, and any practical problem will not arise by selecting l and m to satisfy the relation l, $m \leq 8$. Usually, the number of the comparator blocks is selected to be $2^n$ (where n is a natural number).

Figure 4:
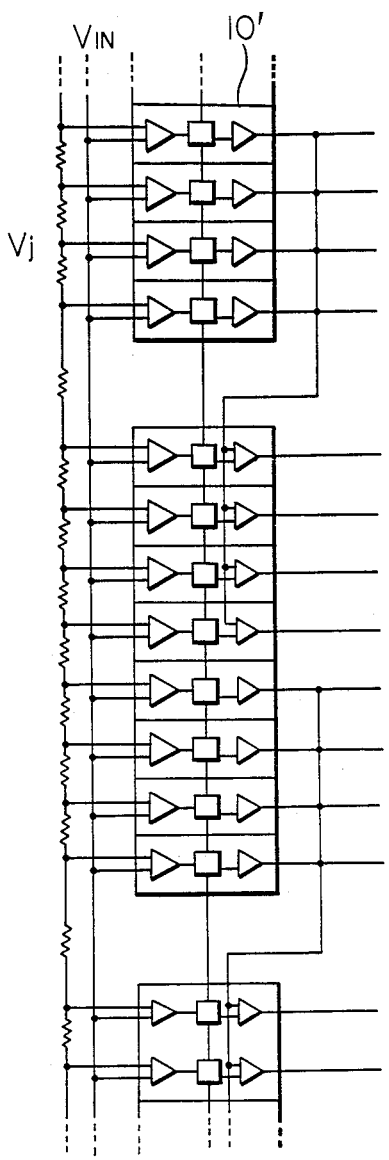
FIG. 4 shows the structure of a second embodiment of the present invention.

FIG. 4 shows a second embodiment of the present invention which is a modification of the first embodiment. In the first embodiment, the logical sum of outputs of plural comparators 10' among those constituting a block of next higher order is used to inhibit generation of outputs from all the comparators 10' constituting a block of next lower order. The second embodiment differs from the first embodiment in that the logical sum of outputs of plural comparators 10' among those constituting a block of next higher order is used to inhibit generation of outputs from only plural higher-order comparators among those constituting a comparator block of next lower order. As described already, simultaneous double appearance of outputs from comparators exerts a great adverse effect on a portion of a binary output signal where a change from "0" to "1" occurs between more significant bits, but does not exert any appreciable adverse effect on a portion of a binary output signal where such a change from "0" to "1" occurs only between less significant bits. Thus, the border dividing one comparator block from the next adjacent one is generally set at a point where such a change occurs between more significant bits. Therefore, simultaneous double appearance of an output from a comparator belonging to a block of next higher order and most adjacent to the border and an output from a comparator belonging to a block of next lower order and most adjacent to the border is preferably prevented, and the logical sum of outputs from plural comparators of lower order in the block of the next higher order is preferably used to inhibit outputs from plural comparators of higher order in the block of next lower order. This arrangement decreases the number of elements connected to the inhibit signal line. (These elements include output transistors of the comparators in the blocks of higher order and input transistors of the comparators in the blocks of lower order. The output transistors are connected in the wired-OR mode, and the input transistors are connected to the inhibit signal line.) Because of the decreased number of such elements, the parasitic capacity can be correspondingly decreased to increase the response speed of the ADC.

In the first and second embodiments described above, appearance of outputs from comparators in a comparator block of next lower order is inhibited by the logical sum of outputs from comparators in a comparator block of next higher order, for conveniences of description. However, it is apparent that the effect is similar to that described above even when appearance of outputs from a comparator block of next higher order is inhibited by the logical sum of outputs from comparators in a comparator block of next lower order.

Figure 5:
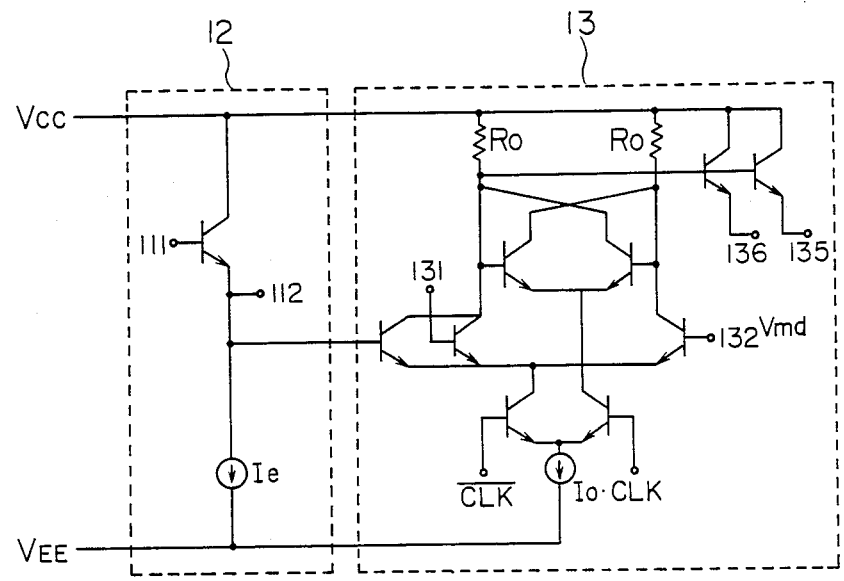
FIG. 5 shows the detailed structure of the internal parts of the comparator used in the embodiments of the present invention.

FIG. 5 shows the detailed structure of the exclusive-OR circuit 12 and the latch 13 with a reset terminal incorporated in the comparator 10' employed in the aforementioned embodiments of the present invention. Referring to FIG. 5, the exclusive-OR circuit 12 is in the form of an emitter follower circuit having a first input terminal 111 connected to the inverted output of the comparing part 11 connected to the exclusive-OR circuit 12 and a second input terminal 112 connected to the output of the comparing part 11 in the next adjacent comparator 10'. Because of the above connections, an output of "L" level appears from the exclusive-OR circuit 12 only when an output of "H" level is generated from the comparing part 11 preceding the exclusive-OR circuit 12, that is, when an inverted output of "L" level is applied, and also when an output of "L" level is generated from the comparing part 11 in the next adjacent comparator 10'. Otherwise, an output of "H" level appears from the exclusive-OR circuit 12. Thus, the logic is accurately the exclusive-NOR. However, the final logic is the exclusive-OR because the output of "L" level is inverted by the latch 13 connected to the output of the exclusive-OR circuit 12. The structure of the latch 13 is such that a third input terminal is associated with one of input terminals of a conventional latch to form an OR gate together with the latter input terminal. The output of the exclusive-OR circuit 12 is connected to this third input terminal, and the inhibit signal from a comparator block of next higher order is connected to a first input terminal 131 of the latch 13. A voltage Vmd intermediate between the "H" level and the "L" level of the output from the exclusive-OR circuit 12 is applied to a second input terminal 132 of the latch 13. Therefore, even when the inhibit signal is in its "H" level, an output of "L" level appears at a first output terminal 135 irrespective of the level of the output of the exclusive-OR circuit 12. On the other hand, when the inhibit signal is in its "L" level, an output of "H" level appears at the first output terminal 135 only when the output of the exclusive-OR circuit 12 is in its "L" level. The first output terminal 135 is connected to the bit line of the associated primary stage encoder 21 in the code conversion circuit 2. A second output terminal 136 has the same potential as that of the first output terminal 135. This second output terminal 136 is connected in a wired-OR mode to those of the other comparators 10' in the block to which the illustrated comparator 10' belongs, so as to generate an inhibit signal to be applied to the comparator block of next lower order. In order that the latch 13 can make the desired operation, the "L" level of the inhibit signal must be lower than the potential Vmd at the second input terminal 132. The "L" level of the inhibit signal is given by Vcc−Ro·Io. Therefore, the values of Vmd, Ro and Io are preferably selected to satisfy the relation $$Vcc - Ro \cdot Io < Vmd \tag{1}$$

It will be understood from the foregoing detailed description of various embodiments of the present invention that the number of comparators included in one block to generate an inhibit signal can be selected independently of the number of comparators connected to each of primary stage encoders in a code conversion circuit. Therefore, the present invention is advantageous in that a missing code can be prevented not only on the basis of a "0"-to-"1" change point between more significant bits but also on the basis of any other point suitably selected as a border. Further, the present invention in which outputs of latches in the comparators are used to provide an inhibit signal is advantageous in that the logical sum can be provided by a wired-OR connection of output terminals of the latches, and the area occupied by the ADC on a semiconductor chip can be correspondingly decreased.

We claim:

1. A flash type AD converter comprising:
a group of comparators, each for comparing an input signal with one of a plurality of reference signals having individually different voltage levels, so that one of said comparators, corresponding to a level change point where the voltage level of the input signal is higher than that of the reference signal of that comparator, generates a specific output difference from the output of the remaining comparators which all have reference signals less than the input signal;
means for generating a binary-coded output on the basis of the specific output generated from the level change point comparator;
wherein said comparator group is divided into blocks each including $2^N$ comparators (N=1, 2, ... ); and
means responsive to any one of a plurality of comparators belonging to one of said comparator blocks generating said specific output, for applying said specific output as an inhibit signal for inhibiting appearance of an output from a block including comparators corresponding to reference signals of a level lower than those of the comparators of said block to which said comparator generating said specific output belongs, whereby said specific output corresponding to said level change point where the voltage level of the input signal is higher than that of the reference is generated by only one comparator out of said group of comparators.

2. A flash type AD converter according to claim 1, wherein said means for applying said specific signal produces said inhibit signal by taking the logical sum of the outputs of the plurality of comparators of said block to which said comparator generating said specific output belongs, thereby inhibiting appearance of the outputs from the comparators of the block including those corresponding to the reference signals of levels lower than those of the comparators of said block to which said comparator generating said specific output belongs.

3. A flash type AD converter according to claim 1, wherein each of said comparators includes a plurality of latches including a first latch and a second latch, and the logical sum of the output from said first latch and the inhibit signal from another comparator is latched by said second latch, thereby attaining gating of the output of said comparator by said inhibit signal.

4. A flash type AD converter comprising:
a group of comparators each comparing an input signal with one of a plurality of reference signals having individually different voltage levels determined according to resolution so that one of said comparators, corresponding to a level change point where the voltage level of the input signal is higher than that of the reference signal of that comparator, generates an output different from those of the remaining comparators, said comparator group being divided into blocks each including $2^N$ comparators (N=1, 2, ... );
first means for converting said comparator output from each said block into a binary code;
second means for synthesizing said converted binary code signal of said blocks to provide a binary-coded output; and
means, responsive to when one of a plurality of comparators including that corresponding to a level change point between more significant bits of a binary code and corresponding to reference levels higher than that of said comparator corresponding to said level change point generates a specific output, for example, an output signal of "H" level, for applying said signal of "H" level as an inhibit signal for inhibiting appearance of outputs from comparators of a block including comparators corresponding to reference signals of levels lower than the levels of the comparators of said block to which said comparator generating the signal of "H" level belongs, whereby said binary code signal input to second means through said first means is generated by only one of said blocks.

5. A flash type AD converter comprising:
a group of comparators, wherein said comparator group is divided into blocks, each block including $2^N$ comparators (N=1, 2, ... ), each comparator comparing an input signal with one of a plurality of reference signals having individually different voltage levels determined according to resolution so that one of said comparators, corresponding to a level change point where the voltage level of the input signal is higher than that of the reference signal of that comparator, generates a specific output different from those of the remaining comparators;

means for generating a binary-coded output on the basis of the specific output generated from the level change comparator; and means associated with each block and responsive to the generation of said specific output by one of the plurality of comparators of the associated block, for utilizing said specific output to generate an inhibit signal for inhibiting appearance of an output from a block including comparators corresponding to reference signal levels lower than those of the comparators of said block to which said level change comparator belongs, wherein said means for utilizing produces said inhibit signal by taking the logical sum of the outputs of the plural comparators of said block to which said level change comparator belongs, thereby inhibiting appearance of the outputs from the comparators corresponding to the reference signal levels lower than those of the comparators of said block to which said level change comparator belongs.

6. A flash type AD converter comprising:

a group of comparators, wherein said comparator group is divided into a group of blocks, each including $2^N$ comparators ($N=1, 2, \ldots$), each for comparing an input signal with one of a plurality of reference signals having individually different voltage levels determined according to resolution so that one of said comparators, corresponding to a level change point where the voltage level of the input signal is higher than that of the reference signal of that comparators, generates a specific output different from those of the remaining comparators;

means for generating a binary-coded output on the basis of the specific output generated from said comparator;

means associated with each first block and responsive to the generation of said specific output by one of the comparators of the block, for utilizing said specific output to generate an inhibit signal for inhibiting appearance of an output from a block including comparators corresponding to reference signals of a level lower than those of the comparators of said block to which the level change comparator belongs, said group is further divided into second blocks each including a plurality of said first blocks; and second means, responsive to one of the plurality of comparators, said plurality including that comparator corresponding to a level change point between more significant bits of a binary code and corresponding to levels higher than that of said comparator corresponding to said level change point generating a second specific output, for applying a signal of "H" level as an inhibit signal for inhibiting appearance of outputs from comparators of a second block including comparators corresponding to reference signals of levels lower than the reference signal levels of the comparators of said second block to which said comparator generating said second specific output belongs.

7. A flash type AD converter comprising:

a group of comparators, wherein said comparator group is divided into blocks each including $2^N$ comparators ($N=1, 2, \ldots$), each for comparing an input signal with one of a plurality of reference signals having individually different voltage levels determined according to resolution, so that one of said comparators, corresponding to a level change point where the voltage level of the input signals is higher than that of the reference signal of that comparator, generates a specific output different from those of the remaining comparators;

means for generating a binary-coded output on the basis of the specific output generated from said level change comparator; and means, responsive to when any one of a plurality of comparators belonging to one of said comparator blocks generates said specific output, for applying said specific output as an inhibit signal for inhibiting appearance of an output from a block including comparators corresponding to a reference signal level higher than those of the comparators of said block to which said comparator generating said specific output belongs, whereby said output corresponding to said level change point where the voltage level of the input signal becomes higher than that of the reference is generated by only one of said comparators.

8. A flash type AD converter comprising:

a group of comparators, said comparator group being divided into blocks each including $2^N$ comparators ($N=1, 2, \ldots$), each comprising an input signal with one of a plurality of reference signals having individually different voltage levels determined according to resolution so that one of said comparators, corresponding to a level change point where the voltage level of the input signal is higher than that of the reference signal of that comparator, generates an output different from those of the remaining comparators;

first means for converting said comparator output from each said block into a binary code;

second means for synthesizing said converted binary code signal of said blocks to provide a binary-coded output; and means, responsive to when one of a plurality of comparators, including that corresponding to a level change point between more significant bits of a binary code and corresponding to reference levels higher than that of said comparator corresponding to said level change point generates a specific output, for example, an output signal of "H" level, for applying said signal of "H" level as an inhibit signal for inhibiting appearance of outputs from comparators of a block including comparators corresponding to reference signals of levels higher than the levels of the comparators of said block to which said comparator generating the signal of "H" level belongs, whereby said binary code signal, which is an input to second means via said first means, is generated by only one of said blocks.

9. A flash type AD converter comprising:

a group of comparators, wherein said comparator group is divided into blocks, each block including $2^N$ comparators ($N=1, 2, \ldots$), each comparator comparing an input signal with one of a plurality of reference signals having individually different voltage levels determined according to resolution so that one of said comparators corresponding to a level change point where the voltage level of the input signal is higher than that of the reference signal of that comparator generates a specific output different from those of the remaining comparators;

means for generating a binary-coded output on the basis of the specific output generated from said level change comparator; and means associated with each block and responsive to the generation of said specific output by one of the plurality of comparators of the associated block, for utilizing said specific output to generate an inhibit signal for inhibiting appearance of an output from a block including comparators corresponding to reference signal levels higher than those of the comparators of said block to which said level change comparator generating said specific output belongs, wherein said means for utilizing produces said inhibit signal by taking the logical sum of the outputs of the plural comparators of said block to which said level change comparator belongs, thereby inhibiting appearance of the outputs from the comparators corresponding to the reference signal levels higher than those of the comparators of said block to which said level change comparator belongs.

10. A flash type AD converter comprising:

a group of comparators, wherein said comparator group is divided into blocks each including $2^N$ comparators (N=1, 2, ...), each for comparing an input signal with one of a plurality of reference signals having individually different voltage levels so that one of said comparators, corresponding to a level change point where the voltage level of the input signal is higher than that of the reference signal of that comparator, generates a specific output different from the output of the remaining comparators which all have reference signals less than the input signal;

means for generating a binary-boded output on the basis of the specific output generated from said level change point comparator;

means responsive to any one of a plurality of comparators belonging to one of said comparator blocks generating said specific output, for applying said specific output as an inhibit signal for inhibiting appearance of an output from a block including comparators corresponding to reference signals of a level lower than those of the comparators of said block to which said comparator generating said specific output belongs, whereby said specific output corresponding to said level change point where the voltage level of the input signal is higher than that of the reference is generated by only one out of said group of comparators;

each given comparator comprising, means for comparing the input signal with the reference signal associated with that comparator;

an exclusive OR circuit having as its inputs an output of said means for comparing and an output of an adjacent comparator having a reference signal of a lower level; and a latch circuit having as its inputs the output of the exclusive OR circuit and the output of a latch circuit of a comparator from a block of comparators, all of whose reference signals have levels higher than the reference signals of the comparators of the block to which the given comparator belongs.

11. A flash type AD converter according to claim 10 wherein said latch circuit comprises, a first input terminal that receives an output of the associated exclusive OR circuit;

a second input terminal that receives an output of a latch circuit of a comparator of another block of comparators;

a third input terminal that receives an intermediate voltage; and means, responsive to the signals of said first, second and third input terminals, for producing a predetermined level when the input on the second input terminal is a first level irrespective of the status of the first input terminal, and producing an output voltage that is defined by the signal in said first input terminal when said signal received at the second input terminal is a second level.

* * * * *

UNITED STATES PATENT AND TRADEMARK OFFICE
CERTIFICATE OF CORRECTION

PATENT NO. : 4,866,444

DATED : September 12, 1989

INVENTOR(S) : Y. NEJIME, et al.

It is certified that error appears in the above-identified patent and that said Letters Patent is hereby corrected as shown below:

Column 2, line 44, change "DESCRIPTION DETAILED" to --DETAILED DESCRIPTION--.

Column 6, line 29, change "conveniences" to --convenience--.

Column 9, line 31, change "comparators," to --comparator,--

Signed and Sealed this

Nineteenth Day of February, 1991

Attest:

HARRY F. MANBECK, JR.

*Attesting Officer*     *Commissioner of Patents and Trademarks*